United States Patent
Giry-Cassan et al.

(10) Patent No.: US 7,076,224 B2
(45) Date of Patent: Jul. 11, 2006

(54) PROCESS FOR CONTROLLING THE GAIN OF A FREQUENCY TUNER, AND CORRESPONDING TUNER, IN PARTICULAR FOR THE RECEPTION OF TERRESTRIAL DIGITAL TELEVISION SIGNALS

(75) Inventors: Florence Giry-Cassan, Grenoble (FR); François van Zanten, Meylan (FR)

(73) Assignee: STMicroelectronics S.A. (FR)

( * ) Notice: Subject to any disclaimer, the term of this patent is extended or adjusted under 35 U.S.C. 154(b) by 544 days.

(21) Appl. No.: 10/310,252

(22) Filed: Dec. 4, 2002

(65) Prior Publication Data
US 2003/0129946 A1 Jul. 10, 2003

(30) Foreign Application Priority Data
Dec. 6, 2001 (FR) .................................... 0115755

(51) Int. Cl.
*H04B 1/06* (2006.01)
*H04B 7/00* (2006.01)

(52) U.S. Cl. ................ 455/241.1; 455/234.1; 455/251.1; 455/192.3; 455/180.3; 455/67.11; 455/136; 455/138; 348/678; 348/685; 348/725; 330/254; 330/278; 330/282

(58) Field of Classification Search .......... 455/234.1, 455/240.1, 241.1, 251.1, 192.3, 180.3, 194.2, 455/136, 138; 348/678, 685, 725; 330/254, 330/278
See application file for complete search history.

(56) References Cited

U.S. PATENT DOCUMENTS

| | | | |
|---|---|---|---|
| 4,748,684 A * | 5/1988 | Wright, Jr. ............... | 455/182.3 |
| 5,353,288 A * | 10/1994 | Abdesselem et al. ....... | 370/332 |
| 5,552,838 A * | 9/1996 | Suizu ......................... | 348/735 |
| 5,603,115 A * | 2/1997 | Ku .............................. | 455/254 |
| 5,732,341 A | 3/1998 | Wheatley, III .......... | 455/234.1 |
| 5,737,033 A * | 4/1998 | Masuda ..................... | 348/678 |
| 5,898,912 A | 4/1999 | Heck et al. .............. | 455/234.2 |
| 5,940,143 A * | 8/1999 | Igarashi et al. ............ | 348/678 |
| 5,999,802 A * | 12/1999 | Aschwanden ............ | 455/196.1 |
| 6,148,189 A * | 11/2000 | Aschwanden ............ | 455/234.1 |
| 6,154,503 A * | 11/2000 | Strolle ........................ | 375/264 |
| 6,324,387 B1 | 11/2001 | Kamgar et al. .......... | 455/234.1 |
| 6,421,099 B1* | 7/2002 | Oh ............................. | 348/732 |
| 6,678,010 B1* | 1/2004 | Jun ............................. | 348/678 |
| 6,714,776 B1* | 3/2004 | Birleson ..................... | 455/302 |

OTHER PUBLICATIONS

Preliminary French Search Report, FR 01 15755, dated Aug. 15, 2002.

* cited by examiner

*Primary Examiner*—Marceau Milord
(74) *Attorney, Agent, or Firm*—Jenkens & Gilchrist, PC

(57) ABSTRACT

A method and device are disclosed for receiving digital television signals by a frequency tuner. The power of the signal is measured after an analog/digital conversion in the frequency tuner, and the gain thereof is controlled on the basis of this power measurement according to a predetermined control law. The power of the analog signal, tapped between an input amplifier stage and a first frequency transposition stage, or immediately after the first frequency transposition stage, is also measured. The measured power is compared with a predetermined power threshold so as to obtain first binary information, and the gain control law is set on the basis of the value of the first binary information.

27 Claims, 2 Drawing Sheets

PROCESS FOR CONTROLLING THE GAIN OF A FREQUENCY TUNER, AND CORRESPONDING TUNER, IN PARTICULAR FOR THE RECEPTION OF TERRESTRIAL DIGITAL TELEVISION SIGNALS

BACKGROUND OF THE INVENTION

1. Technical Field of the Invention

The invention relates to the decoding of a radio frequency transmission channel conveying coded digital information. It applies advantageously but not limitingly to receiving and decoding terrestrial digital television signals.

The invention thus relates more especially to tuners, in particular those of the double-conversion type, such as for example those incorporated into the modulation/demodulation devices (modems) intended for receiving terrestrial digital signals, that is to say those conveyed by cable.

In the case of cable reception, the input frequencies of the signal are spread over a span of from 47 MHz to 864 MHz in intervals of 6 or 8 MHz. This represents 135 channels. An extension to 1 GHz is moreover envisaged in the future.

2. Description of the Related Art

At present, modems are equipped with a head filter. For reasons of economy, the elimination of this head filter is envisaged. This consequently implies that 135 channels can enter the tuner, this representing a considerable input dynamic range. It is consequently necessary to control the gain of the input amplifier stage of the modem so as to avoid nonlinearities which would be caused by a saturation phenomenon, and to do so without excessively degrading the signal-to-noise ratio.

At present, the power of the signal is measured after analog/digital conversion and the gain of the tuner is controlled on the basis of this power measurement according to a predetermined control law. However, the adjustment of the gain does not in any way depend on the power of the signal entering the tuner, but only on the power of the desired signal.

SUMMARY OF THE INVENTION

The invention aims to afford another solution to the control of the gain of a tuner.

Implementations of the invention limit the dynamic range required, in particular on the input amplifier stage and the first frequency transposition stage (mixer) of the tuner.

The invention therefore proposes a process for controlling the gain of a frequency tuner, in particular of the double-conversion type, in which the power of the signal is measured after an analog/digital conversion, and the gain is controlled on the basis of this power measurement according to a predetermined control law.

According to a general characteristic of the invention, the power of the analog signal, tapped off between an input amplifier stage and a first frequency transposition stage or immediately after the first frequency transposition stage, is measured. The measured power is compared with a predetermined power threshold so as to obtain first binary information, and the gain control law is set on the basis of the values of binary control information obtained from the said first binary information.

Thus, according to an implementation of the present invention, if the measured power is greater than the threshold, the control law is modified, while the control law is left unchanged otherwise. The received signal power information can be extracted, either at the output of the input amplifier stage, or at the output of the mixer. A person skilled in the art will be able to choose the optimal tap off point as a function of the envisaged application and the desired and/or required performance.

Specifically, in one case the detection of signal power at the output of the input amplifier stage may exhibit a significant load which may penalize this input amplifier stage, especially at high frequencies.

However, in the case of a tuner of the double-conversion type, a bandpass filter is generally integrated at the output of the mixer, thus incurring the risk, in certain instances, of no longer observing jammers (i.e., transmitting devices that jam channels at predetermined frequency ranges) at the extremity of the pass band of the bandpass filter.

Also, in general, if the input amplifier stage is not overly penalized, it may be worthwhile placing the detection of signal power at its output.

If the signal power lies relatively close to the reference threshold adopted, there is a risk of sensitivity to small variations. Also, in this case, it may be preferable to provide for a comparison in a hysteresis-type comparator, i.e. a comparator having hysteresis.

Although the invention applies to all types of tuners, such as for example tuners with zero intermediate frequency and/or used for GSM reception, implementations of the invention apply advantageously to double-conversion tuners, such as those deployed in modems connected to transmission cables for terrestrial digital signals. A tuner of the double-conversion type furthermore may comprise a second transposition stage connected downstream of the first transposition stage and a second amplification stage connected downstream of the second transposition stage. The control law may be used in controlling a first adjustment of the gain of the input amplifier stage and a second adjustment of the gain of the second amplification stage.

According to an implementation of the invention, the modification of the control law, which occurs when the measured power is greater than the threshold, may be used to thereafter perform, for example, an additional decrease of the gain of the input amplifier stage and an increase of the gain of the second amplification stage.

An implementation of the invention is a frequency tuner, for example embodied at least partially in an integrated manner on a semiconductor substrate, comprising an analog block comprising controllable-gain amplification means including at least one input amplifier stage and at least one first frequency transposition stage connected downstream of the input amplifier stage, as well as a digital block connected to the analog block by an analog-to-digital conversion stage and comprising first measurement means for measuring the power of the signal generated by the conversion stage, and gain control means for controlling the gain of the amplification means on the basis of the power measurement and the control law.

According to a general characteristic of the invention, the frequency tuner furthermore includes second measurement means, connected between the input amplifier stage and the first frequency transposition stage or immediately after the first frequency transposition stage, for measuring the power of the tapped analog signal; comparison means, such as a comparator having hysteresis, for comparing the power thus measured with a predetermined threshold and delivering first binary information; and control means, connected between the comparison means and the gain control means, for selectively setting the control law on the basis of the values of binary control information obtained from the first binary information.

According to an embodiment of the invention, the frequency tuner furthermore comprises means for storing the first binary information, for example a D flip-flop connected to the output of the comparator; and filtering means, connected between the output of the D flip-flop and the control means, for performing a filtering of the information provided by the D flip-flip, so as to deliver the binary control information.

If the measured power is greater than the predetermined threshold, the control means, for example, modifies the control law, and otherwise leaves the control law unchanged.

In the case, for example, where the frequency tuner is of the double-conversion type, the control means, for example, modifies the control law which may result in additionally decreasing the gain of the input amplifier stage and increasing of the gain of the second amplification stage.

An application of the invention may be as a receiver of terrestrial digital signals, comprising a frequency tuner as defined hereinabove.

BRIEF DESCRIPTION OF THE DRAWINGS

Other advantages and characteristics of the invention will become apparent upon examining the following detailed description, which is in no way limiting, and the appended drawings, in which.

DETAILED DESCRIPTION OF EXEMPLARY EMBODIMENTS OF THE INVENTION

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
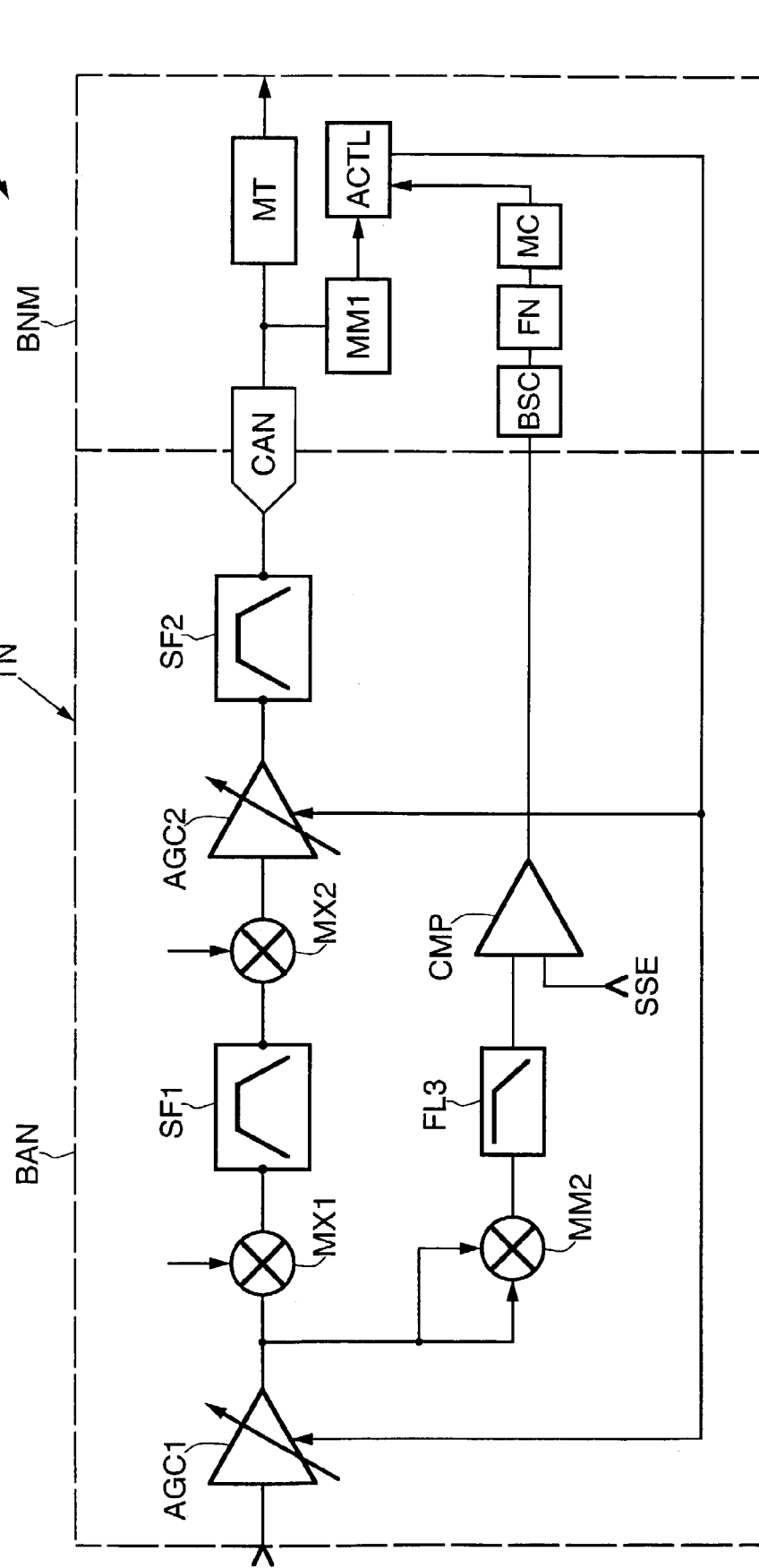
FIG. 1 diagrammatically illustrates a frequency tuner according to an embodiment of the invention.

In FIG. 1, the reference "RCP" designates a terrestrial digital television signals receiver connected to a cable conveying the signals, this receiver being intended to receive and to decode the signals.

The receiver RCP may comprise at the head end a tuning device or tuner, TN, intended for selecting the desired channel from among the set of channels present in the signal received at the input of receiver RCP.

The tuner TN may be of the double-conversion type, that is to say it comprises two frequency transposition stages or mixers, MX1 and MX2.

Thus, while the input frequencies of the input signal may be spread from 47 MHz to 864 MHz, in intervals of 6 or 8 MHz, the first mixer performs a transposition at a frequency of, for example, the order of 122 MHz. The second mixer MX2 reduces the frequency to 44 MHz, for example.

Upstream of the first mixer MX1 is a control-gain input amplifier stage AGC1.

The mixer MX1 may be followed by an external bandpass filter SF1 filtering, for example, in the 1090 MHz–1220 MHz band.

A second control-gain amplification stage AGC2 may be disposed between the second mixer MX2 and a second external bandpass filter SF2 centered, for example, around approximately 44 MHz.

Together, these components form part of an analog block BAN, which is linked to a digital block BNM by way of an analog-to-digital conversion stage CAN.

Digital block BNM may comprise a processing means for performing, in a conventional manner, processing for demodulating and decoding the symbols conveyed in the received signal. The processing means may, for example, include conventional demodulation circuitry and decoding circuitry.

Moreover, the digital block BNM may comprise first measurement means MM1 for calculating the power of the digital samples tapped at the output of the conversion stage CAN. First measurement means MM1 may be implemented as conventionally known circuitry that measures signal power. Gain control means and/or device ACTL, of conventionally known structure and known manner of operation, may then control the gain G1 of the amplifier stage AGC1 and the gain G2 of the amplifier stage AGC2 on the basis of the digital power thus calculated, and of a predefined control law. By way of example, the gains G1 and G2 may vary in intervals of approximately 8 dB.

According to the invention, the analog block BAN may furthermore comprise second measurement means and/or device MM2 formed here of a multiplier whose two inputs are coupled to the output of the input amplifier stage AGC1. The output of the multiplier therefore supplies, by multiplying its input signal by itself, power information for the analog signal tapped at the output of the amplifier stage AGC1.

This power measurement is filtered in a low-pass filter FL3, in such a way as to retain only the DC component which relatively accurately represents the power level of the input signal. By way of example, it will be possible to choose a low-pass filter whose cut-off frequency is of the order of approximately 50 KHz, thereby making it possible to eliminate the smallest of the parasitic frequencies, of the order of 6 MHz. This smallest parasitic frequency is equal to F2-F1, where F2 represents the frequency of a jammer and F1 represents the frequency of the input signal or of a jammer.

A comparator CMP makes it possible to compare the total power output from the filter FL3 with a threshold SSE. This threshold SSE can be programmed via an I2C bus in such a way as to allow greater fineness of control of the gain of amplifier stages AGC1 and AGC2.

Of course, the reference threshold SSE depends on the application envisaged and on the accuracy required.

By way of example, in the case of cable reception, this reference threshold SSE can be fixed at approximately −27.75 dBm seen from the input, which corresponds to approximately 135 spectral lines at 0 dBm.

The output of the comparator CMP is therefore a signal taking the voltage level, for example, 0v or Vdd (for example 5 volts), as a function of the comparison. This output of the comparator CMP therefore supplies first information which may be regarded as binary and which may therefore be coded as logic 0 or logic 1.

If the power received lies in a manner very close to the reference threshold SSE, there is a risk of sensitivity to small variations. To avoid this, hysteresis is advantageously utilized in the comparator CMP.

Moreover, a D flip-flop, referenced as BSC in FIG. 1, is connected between the output of the comparator CMP and the input of a digital filter FN. This flip-flop BSC makes it possible to store the binary information provided by the comparator CMP.

The digital filter FN makes it possible to average the binary information delivered by the flip-flop BSC and to deliver filtered binary information, hereinafter referred to as "binary control information".

By way of example, the digital filter FN can perform a sliding average over a few symbol durations, for example over about 10 samples.

Control means and/or circuit MC will then set the control law incorporated into the control means and/or circuit ACTL as a function of the binary control information value delivered by the digital filter FN. The control means ACTL includes circuitry that generates control signals for controlling the gains of amplifiers AGC1 and AGC2.

Figure 2:
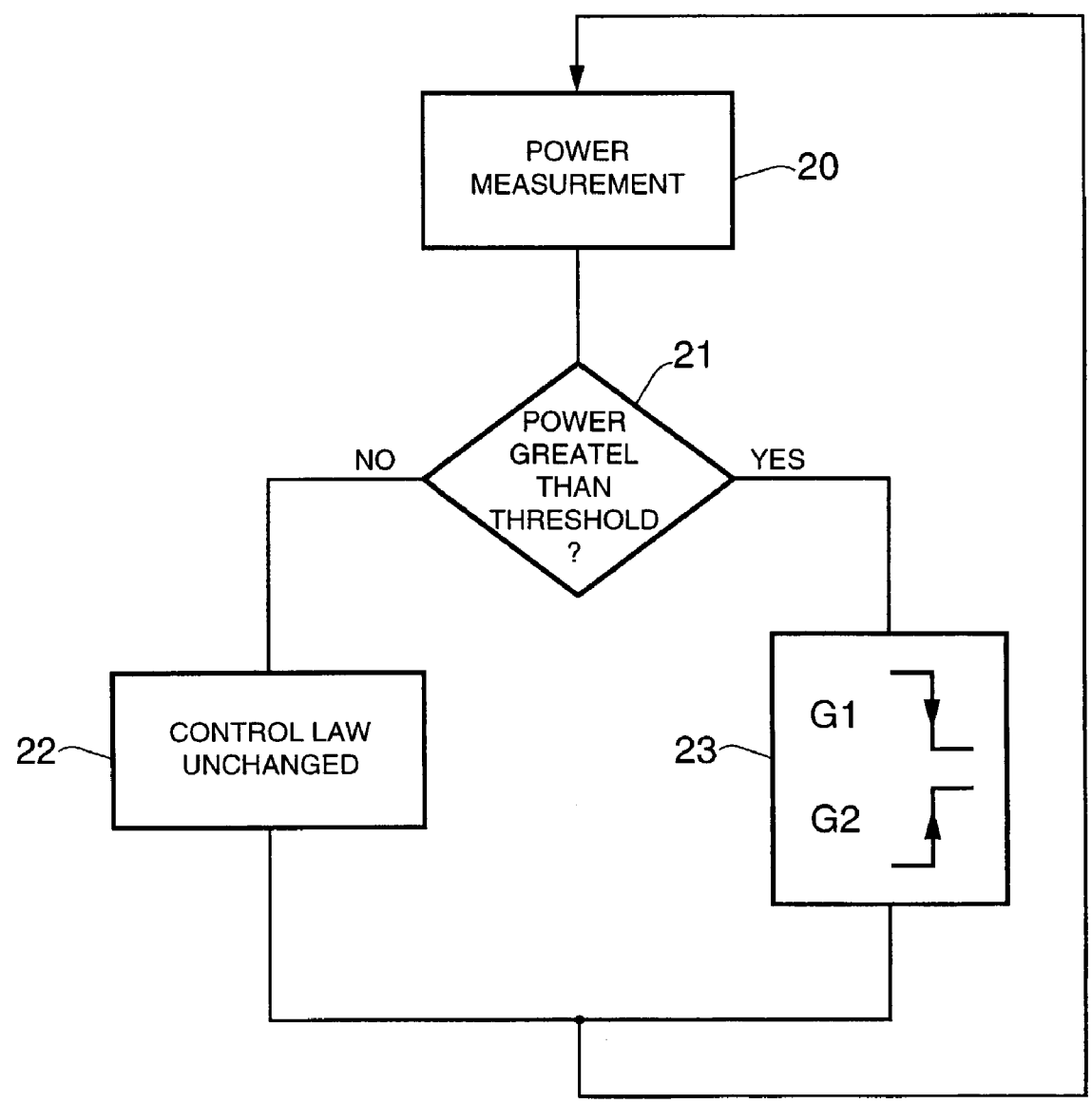
FIG. 2 is a simplified flowchart illustrating an operation of the tuner of FIG. 1.

Thus, referring more especially to FIG. 2, it may be seen that if the power measured in step 20 is greater than the reference threshold SSE (step 21), this being equivalent, for example, to control information provided by flip flop BSC equal to logic 1, the gain G1 is decreased by control means ACTL by a further 8 dB amount (8 dB corresponding, for example, to the interval adopted for the interval step-wise control of the input amplifier AGC1), while the gain G2 of the amplifier AGC2 is increased by 8 dB (step 23).

If, on the other hand, the measured power is less than the reference threshold SSE, then the control law is unchanged by control means MC (step 22) and the gains G1 and G2 of the amplifiers AGC1 and AGC2 continue to be controlled by the control law of the control means ACTL without change thereto.

The invention therefore proposes a gain control process which operates permanently during the operation of the receiver and which thus makes it possible to limit the input dynamic range required, in particular on the input amplifier stage AGC1, by taking note of the power which actually enters the tuner, without thereby overly degrading the signal-to-noise ratio.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for controlling the gain of a frequency tuner having an input amplifier stage, a first mixer coupled to an output thereof and an analog-to-digital conversion component, comprising:
   measuring signal power of a signal corresponding to an output of the analog-to-digital conversion component;
   measuring signal power of the signal corresponding to an output of the input amplifier stage or an output of the first mixer;
   comparing the signal power measured corresponding to the output of the input amplifier stage or the output of the first mixer to a predetermined reference power threshold and generating first binary information based upon the comparison;
   determining a control law based upon the first binary information; and
   controlling a gain of the input amplifier stage based upon the measured signal power of the signal corresponding to an output of the analog-to-digital conversion component and the control law.

2. The process according to claim 1, further comprising filtering said first binary information, said gain of said input amplifier stage is controlled based upon said filtered first binary information.

3. The process according to claim 1, wherein said determining step comprises modifying the control law if said signal power measured corresponding to the output of the input amplifier stage or the output of the first mixer is greater in magnitude than the predetermined reference power threshold, and refraining from modifying the control law otherwise.

4. The process according to claim 1, wherein the tuner is of the double-conversion type and further includes a second mixer connected downstream of the first mixer and a second amplification stage connected downstream of the second mixer, and said step of controlling comprises adjusting the gain of the input amplifier stage and the gain of the second amplification stage based upon said control law.

5. The process according to claim 4, wherein said controlling comprises selectively decreasing the gain of the input amplifier stage and increasing the gain of the second amplification stage.

6. A frequency tuner, comprising:
   an analog block comprising:
   a controllable-gain amplification component including at least one input amplifier stage and at least one first frequency transposition stage coupled downstream of the at least one input amplifier stage; and
   a digital block coupled to the analog block by an analog-to-digital conversion stage and comprising first measurement means for measuring signal power of a signal corresponding to an output of the analog-to-digital conversion stage, and gain control means for controlling the gain of the controllable-gain amplification component on the basis of the power measurement and a control law;
   the analog block further comprises:
   second measurement means, coupled between the at least one input amplifier stage and the at least one first frequency transposition stage or after the first frequency transposition stage, for measuring the power of the analog signal appearing at the input of the second measurement means; and
   comparison means for comparing the power of the analog signal measured by the second measurement means to a predetermined threshold, and delivering first binary information;
   the digital block further comprises:
   control means coupled between the comparison means and the gain control means, for setting the control law based upon the first binary information.

7. The tuner according to claim 6, wherein the comparison means comprises a comparator circuit having hysteresis.

8. The tuner according to claim 6, further comprising:
   a flip-flop coupled to an output of the comparison means; and
   filtering means, connected between the flip-flop and the control means, for filtering an output of said flip-flop.

9. The tuner according to claim 6, wherein if the power measured by the first measurement means is greater than the predetermined threshold, the control means modifies the control law, and if the power measured by the first measurement means is less than the predetermined threshold, the control means does not modify the control law.

10. The tuner according to claim 6, wherein the tuner is of the double-conversion type and further comprises, in the analog block, a second transposition stage coupled downstream of the first transposition stage and a second amplification stage coupled downstream of the second transposition stage, wherein said control law corresponds to selectively performing a first adjustment of the gain of the input amplifier stage and a second adjustment of the gain of the second amplification stage.

11. The tuner according to claim 10, wherein the control means selectively modifies the control law so than the gain control means selectively additionally decreases the gain of the input amplifier stage and increases the gain of the second amplification stage.

12. The tuner of claim 6, wherein the tuner forms part of a receiver for receiving terrestrial digital signals.

13. A tuner, comprising:
   a first amplifier stage for receiving a signal;
   a first mixer device coupled to an output of the first amplifier stage;
   an analog-to-digital converter coupled to process signals which are output from the first mixer device;
   a first power measuring device having an input coupled to an output of the analog-to-digital converter and an output, for measuring signal power;
   a second power measuring device having an input coupled to an output of the first amplifier stage and an output, for measuring signal power; and
   a control device having inputs coupled to outputs of the first and second power measuring devices and an output coupled to the first amplifier stage, for controlling a gain of the first amplifier stage based upon the outputs of the first and second power measuring devices.

14. The tuner of claim 13, wherein the second power measuring device comprises a second mixer device.

15. The tuner of claim 14, wherein the second power measuring device further comprises a filter coupled to the second mixer device.

16. The tuner of claim 13, further comprising a comparator coupled to receive the output of the second power measuring device and having an output coupled to an input of the control devices.

17. The tuner of claim 16, further comprising a storage device coupled between the comparator and the input of the control device.

18. The tuner of claim 17, further comprising a filter coupled between the storage device and the control device.

19. The tuner of claim 17, wherein the storage device comprises flip flop circuitry.

20. The tuner of claim 16, further comprising a second control device coupled between the comparator and the control device, the second control device generating a control law for use by the control device in controlling the gain of the first amplifier stage, the control law being selectively modified based upon an output of the comparator.

21. The tuner of claim 20, wherein the control law is modified upon the output of the comparator being in a first logic state and unmodified upon the output of the comparator being in a second logic state.

22. The tuner of claim 16, wherein the comparator utilizes a hysteresis effect.

23. The tuner of claim 13, further comprising a second mixer device coupled between the first mixer device and the analog-to-digital converter.

24. The tuner of claim 23, further comprising a filter coupled to the second mixer device.

25. The tuner of claim 13, further comprising a second amplifier stage coupled between the first mixer device and the analog-to-digital converter and having a gain controlled by the control device.

26. The tuner of claim 13, wherein the control device controls the gain of the first amplification stage in increments of 8 dB.

27. The tuner of claim 13, wherein the tuner receives digital television signals.

* * * * *

UNITED STATES PATENT AND TRADEMARK OFFICE
CERTIFICATE OF CORRECTION

| | | |
|---|---|---|
| PATENT NO. | : 7,076,224 B2 | Page 1 of 1 |
| APPLICATION NO. | : 10/310252 | |
| DATED | : July 11, 2006 | |
| INVENTOR(S) | : Florence Giry-Cassan et al. | |

It is certified that error appears in the above-identified patent and that said Letters Patent is hereby corrected as shown below:

Column 7, line 35,        Replace "control devices."
Claim 16                   With --control device.--

Signed and Sealed this

Twenty-eighth Day of November, 2006

JON W. DUDAS
*Director of the United States Patent and Trademark Office*